United States Patent [19]
DeReggi et al.

[11] Patent Number: 4,954,481
[45] Date of Patent: Sep. 4, 1990

[54] SUPERCONDUCTOR-POLYMER COMPOSITES

[75] Inventors: Aimé S. DeReggi, Boyds; Chwan-Kang Chiang, Rockville; George T. Davis, Gaithersburg, all of Md.

[73] Assignee: The United States of America as represented by the Secretary of Commerce, Washington, D.C.

[21] Appl. No.: 292,601

[22] Filed: Dec. 29, 1988

[51] Int. Cl.$^5$ ............................................. B32B 3/02
[52] U.S. Cl. ........................................ 505/1; 505/701; 505/702; 505/703; 505/704; 428/323; 428/327; 428/329; 428/331; 428/411.1; 428/457; 428/688; 428/901; 428/930
[58] Field of Search ............................ 505/1, 701–704; 428/323, 411.1, 457, 688, 901, 930, 327, 329, 331

[56] References Cited

U.S. PATENT DOCUMENTS 4,152,386 5/1979 Winter ................................. 252/512
4,647,888 3/1987 Woolf et al. ........................ 505/887

Primary Examiner—Patrick Ryan
Attorney, Agent, or Firm—Thomas Zack; Alvin J. Englert; Holly D. Kozlowski

[57] ABSTRACT

Superconductor-polymer composite materials comprise a matrix formed of a thermoplastic polymer and a superconductor powder dispersed in the matrix. The superconductor powder preferably has a composition $RBa_2Cu_3O_{7-x}$ wherein R is a rare earth metal and x is less than or equal to 1. The thermoplastic polymer matrix comprises a vinylidene fluoride homopolymer or copolymer. The composite materials may be formed as shaped products, sheets or films.

8 Claims, No Drawings

SUPERCONDUCTOR-POLYMER COMPOSITES

FIELD OF THE INVENTION

The present invention relates to superconductor-polymer composite materials and to methods of forming shaped composite materials and composite sheet materials. More particularly, the invention relates to superconductor-polymer composite materials comprising a matrix formed of a thermoplastic polymer and a superconductor powder dispersed in the matrix.

BACKGROUND OF THE INVENTION

It has recently been discovered that certain mixed metal oxide materials exhibit high-temperature superconductivity. See, for example, Wu et al, *Physical Review Letters,* Vol. 58, No. 9, pages 908-910 and Moodenbaugh et al, *Physical Review Letters,* Vol. 58, No. 18, pages 1885-1887. Specifically, various mixed metal oxide materials comprising rare earth metal oxides, alkaline earth metal oxides and copper oxides have been discovered to exhibit high temperature superconductivity. The rare earth oxide-alkaline earth oxide-copper oxide superconductor materials are generally of the formula $RBa_2Cu_3O_{7-x}$ where x is less than or equal to 1. Because the superconducting transition temperature $T_c$ of such materials is greater than 77° K., these mixed oxide materials have an increasing number of promising technological applications.

However, the ceramic nature of the superconductor materials poses a number of problems for the manufacture of high $T_c$ superconducting shaped products such as magnetic levitation components and magnetic shielding devices. Additionally, because the mixed oxide superconducting materials are susceptible to degradation by moisture and chemicals such as reducing agents, their use in various applications is limited.

SUMMARY OF THE INVENTION

Accordingly, it is an object of the present invention to provide superconductor composite materials which facilitate the cost effective manufacture of high $T_c$ superconducting products of various shapes. It is an additional object of the invention to provide superconductor composite materials which are resistant to degradation of the superconducting properties thereof owing to exposure to moisture and chemicals such as reducing agents. It is a further object of the invention to provide a superconductor composite material which is suitable for use in preparing magnetic levitation components, magnetic shielding devices and the like.

These and additional objects are provided by the superconductor-polymer composite materials and methods according to the present invention. The composite materials of the invention comprise a matrix formed of a thermoplastic polymer and a superconducting powder dispersed in the matrix. The superconductor powder preferably has a composition $RBa_2Cu_3O_{7-x}$ wherein R is a rare earth metal and x is less than or equal to 1. According to the methods of the present invention, the composite materials may be formed as shaped products, sheets or films and therefore facilitate the manufacture of high $T_c$ superconducting devices of various shapes. Additionally, the polymeric matrix protects the mixed oxide superconductors from exposure to deleterious environmental effects, for example, moisture and chemicals such as reducing agents.

These and additional objects and advantages will be more apparent in view of the following detailed description.

DETAILED DESCRIPTION

The superconductor-polymer composites according to the present invention comprise a matrix formed of a thermoplastic polymer and a superconductor powder dispersed in the matrix. The polymer matrix acts as a binder for the superconductor powder and is chemically nonreactive with the superconductor powder in order that the superconducting properties of the superconductor powder are not degraded. It is important that the thermoplastic polymer is impervious to moisture and to chemicals present in the atmosphere or environment during use of the composite material in order to protect the chemically delicate superconductor powder. The polymer matrix must also exhibit suitable thermal and mechanical properties which allow it to withstand repeated cooling and warming between room temperature and cryogenic temperatures during its service life. It is also desirable that the thermoplastic polymer has room temperature flexibility and therefore that its glass transition temperature is less than about 25° C. In many applications, it is desirable that the glass transition temperature of the polymer matrix is well below room temperature, for example, as low as −40° C.

In a preferred embodiment, the thermoplastic polymer which forms the matrix of the polymer material comprises a vinylidene fluoride homopolymer or copolymer. Such polymers are preferred in that they exhibit low glass transition temperatures, suitable thermal and mechanical properties and good toughness. In addition, the vinylidene fluoride polymers exhibit good mold release properties and favorable extrusion properties which permit processing in convenient forms such as rolls of sheet material or film, wires, tapes and molded shapes. Both homopolymers and copolymers of vinylidene fluoride are preferred for use in the composite materials of the present invention. Vinylidene fluoride copolymers may be formed of one or more comonomers such as fluorinecontaining olefins copolymerized with vinylidene fluoride. Suitable fluorine-containing olefins include vinyl fluoride, trifluoroethylene, chlorofluorovinylidene, trifluorochloroethylene, tetrafluoroethylene and hexafluoropropylene. Preferred comonomers comprise tetrafluoroethylene and trifluoroethylene. Additionally, the vinylidene fluoride homopolymers or copolymers may be blended with one or more additional polymers for use in the matrix of the composite material of the invention. Examples of additional polymers suitable for blending with vinylidene fluoride homopolymers or copolymers include acrylate polymers, methacrylate polymers and vinyl chloride polymers. A preferred thermoplastic blend for use as the matrix comprises a homopolymer or copolymer of vinylidene fluoride with poly (ethylmethacrylate).

The superconductor powder which is dispersed in the thermoplastic polymer matrix is a mixed oxide material which exhibits the superconducting Meissner effect at temperatures greater than 77° K. The superconductor material is in powder form and preferably has a composition $RBa_2Cu_3O_{7-x}$ wherein R is a rare earth metal and x is less than or equal to 1. Other superconducting materials which exhibit the Meissner effect at temperatures greater than 77° K. are also suitable for use in and within the scope of the present invention. Preferably, the superconductor powder comprises $YBa_2Cu_3O_{7-x}$ where x is less than or equal to 1.

A wide range of loading of the superconductor powder component may be used in the composite materials of the present invention. In applications such as magnetic levitation, the required diamagnetic function of the composite material does not require electrical continuity from one superconducting powder particle to another so that lower loadings of superconducting powders may be used. The amount of superconductor powder included in the composites determines the mechanical properties and the effective magnetic susceptibility of the composite. The effective magnetic susceptibility may be anywhere between 0 and −1, values close to −1 corresponding to composite materials containing close to 100 percent superconductor powder and values close to 0 corresponding to composite materials containing close to 0 percent superconductor powder. Preferably, the composite materials according to the present invention comprise from about 20 to about 80 weight percent superconductor powder.

The composite materials according to the present invention may further include conventional additives for their intended purposes, for example, mold-release agents, chemical agents and the like.

The present invention also relates to methods for forming shaped products, sheets or films comprising the composite materials. In a first embodiment of the present method, the composite material is formed into a shaped product by pressure molding powdered mixtures of the thermoplastic polymer and the superconductor. For example, a superconductor powder such as $YBa_2Cu_3O_{7-x}$ having a $T_c$ of 90° K. is ground into powder form and thoroughly mixed with polyvinylidene fluoride powder having a melting temperature of approximately 450° K. The resulting mixture is introduced into a shaped mold and heated up to the melting point of the polymer powder so that the polymer powder grains fuse together and bind to the superconductor powder grains or immobilize the superconductor powder grains therein without necessarily binding thereto. The mold is then allowed to cool and the molded composite material is removed. During the heating step, the mixture may also be subjected to a compacting pressure so that the mixture is compacted at the same time that it is heated. Magnetic levitation components in shapes ranging from simple pads to complicated structures may be fabricated in this manner.

In a second embodiment of the present method, the mixed powders of the polymer and the superconductor are hot pressed and fused into a flat sheet. After cooling to room temperature, the sheet is flexible and may be rolled into a shape, for example, a cylindrical shell, or formed by pressure by further heating, or both, into more complex shapes such as spherical or dome-shaped products. A plurality of shells of varying dimensions formed according to this method may be assembled to form a multiple layered enclosure such as a series of coaxial cylindrical shells or concentric spherical shells. Such enclosures, when cooled below the superconducting transition temperature $T_c$ constitute magnetic shields because of the flux exclusion properties of the superconductor particles and their collective response to external magnetic fields. This collective response is equivalent in effect to the response of a homogeneous medium with an effective negative magnetic susceptibility.

The composite materials according to the present invention therefore allow the use of superconducting materials in an increased number of technological applications. The preferred embodiments set forth above are intended to illustrate specific embodiments of the invention and are not intended to limit the scope of the compositions and methods of the present invention. Additional embodiments and advantages within the scope of the claimed invention will be apparent to one of ordinary skill in the art.

What is claimed is:

1. Composite material, comprising a matrix formed of a thermoplastic polymer and a superconductor powder dispersed in the matrix, the superconductor powder having a composition $RBa_2Cu_3O_{7-x}$ wherein R is a rare earth metal and x is less than or equal to 1, said thermoplastic polymer comprising a vinylidene fluoride homopolymer or copolymer.

2. Composite material as defined by claim 1, wherein the thermoplastic polymer exhibits a glass transition temperature less than about 25° C.

3. Composite material as defined by claim 1, wherein the thermoplastic polymer comprises a copolymer of vinylidene fluoride and a monomer selected from tetrafluoroethylene and trifluoroethylene.

4. Composite material as defined by claim 1, wherein the matrix further includes an acrylate or methacrylate polymer.

5. Composite material as defined by claim 1, wherein the superconductor powder comprises $YBa_2Cu_3O_{7-x}$ where x is less than or equal to 1.

6. Composite material as defined by claim 1, wherein the superconductor powder is included in an amount of from about 20 to about 80 weight percent.

7. Composite material, comprising a matrix formed of polyvinylidene fluoride and a superconducting powder of the composition $YBa_2Cu_3O_{7-x}$ where x is less than or equal to 1, dispersed in the matrix.

8. Composite material, comprising a matrix formed of a thermoplastic polymer and a superconductor power dispersed in the matrix, the superconductor powder comprising a mixed metal oxide amterial which exhibits the superconducting Meissner effect at temperatures greater than 77° K., the thermoplastic polymer comprising a vinylidene fluoride homopolymer or copolymer.

* * * * *